United States Patent [19]
Ennis et al.

[11] Patent Number: 5,293,085
[45] Date of Patent: Mar. 8, 1994

[54] GAAS DRIVER CIRCUIT

[75] Inventors: John J. Ennis, Corona; Gary L. Heimbigner, Anaheim, both of Calif.

[73] Assignee: Rockwell International Corporation, Seal Beach, Calif.

[21] Appl. No.: 728,546

[22] Filed: Apr. 29, 1985

[51] Int. Cl.$^5$ .............. H03K 19/094; H03K 19/0175; H03K 19/017

[52] U.S. Cl. .................. 307/475; 307/443; 307/446; 307/448; 307/450; 307/571; 307/270; 307/362

[58] Field of Search ............. 307/443, 446, 448, 450, 307/475, 571, 270, 362

[56] References Cited

U.S. PATENT DOCUMENTS 4,410,815  10/1983  Ransom et al. .............. 307/475
4,490,632  12/1984  Everett et al. .............. 307/475
4,496,856   1/1985  Ransom et al. .............. 307/264 X

OTHER PUBLICATIONS

Van Tuyl et al, "High-Speed Integrated Logic with GaAs MESFETs"; *IEEE JSSC*, vol.-SC.9, No. 5, pp. 269–276; Oct. 1974.

*Applications of GaAs MESFETs*, edited by R. Soares et al; pp. 342–352; copyright 1983, Artech House, Inc. (pub.).

*Primary Examiner*—John B. Sotomayor
*Attorney, Agent, or Firm*—H. Fredrick Hamann; George A. Montanye; David J. Arthur

[57] ABSTRACT

The invention comprises a gallium arsenide driver with float capability for logic high and logic low signals including logic means for receiving an input signal and providing logic high and low signals therefrom. Level shift means responsive to the high and low signals downshift the voltage levels thereof. Common gate means responsive to the downshifted signal voltage levels amplify these signals, and output source-follower means responsive to the amplified signals provide output signals to a pad.

4 Claims, 1 Drawing Sheet

GAAS DRIVER CIRCUIT

This invention was made with Government support under Contract No. DASG60-82-C-0051, awarded by the Army. The Government has certain rights in this invention.

BACKGROUND OF THE INVENTION

1. Field of the Invention

The invention relates to a GaAs driver employing MESFETS, diodes, and optionally saturated resistors.

2. Description of the Prior Art

The closest prior art known is S. A. Ransom et al U.S. Pat. No. 4,410,815, entitled Gallium Arsenide To Emitter Coupled Logic Level Converter, issued Oct. 18, 1983. It discloses an alternate approach to achieving the function of a GaAs driver capable of signal level shifting and amplification. It depends upon differential amplification and correspondingly necessary circuits rather than the application of a predetermined reference voltage to the gate of a common gate amplifier.

The present invention may uniquely employ saturated resistors and also operate at much lower voltages with all attendant advantages, and is not limited to driving ECL circuits or GaAs circuits; but, with $V_{BB}$ increased, it will also drive TTL circuits.

SUMMARY OF THE INVENTION

The subject driver is a gallium arsenide circuit for amplifying the power level of logic one and logic zero signals, and applying them to a transmission line. It comprises a logic section, a level shift or voltage downshift section, a common gate amplifier, an optional source follower section, and an output source follower. The logic section rapidly applies high and low signals to the level shift section for voltage level downshifting and the common gate amplifier is biased such that it is off for high signals applied to its source from the downshift section and is on for low signals. The optional source follower acts as a buffer device for the output stage which is off for low signals and conductive for high signals. The circuit finds applicability in all gallium arsenide circuit uses requiring bidirectional pads and/or external 'ORing' functions.

DESCRIPTION OF A PREFERRED EMBODIMENT

Figure 1:
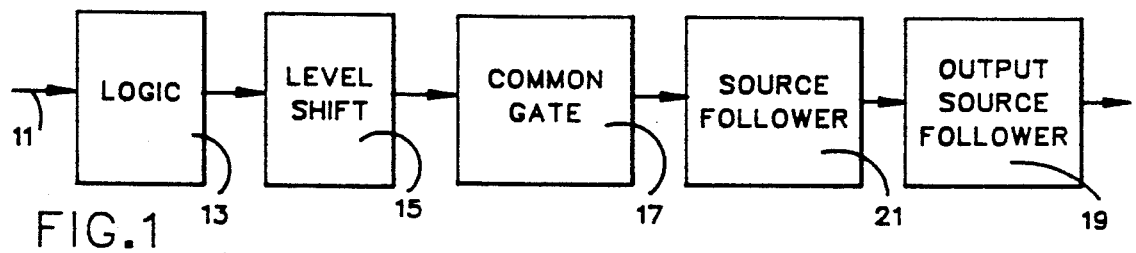
FIG. 1 is a block diagram indicating the functions of the various sections of the driver.

Referring now to FIG. 1, a logic block 13 receives its input signals from lead 11 in the form of 0 or 1 binary signals. The signals are applied to level shift 15 and thence to common gate 17 which amplifies the lows or 0's that turn off the output source follower stage 19 to disconnect it from the pad or transmission line system. The highs or 1's influence source follower 21 oppositely from the lows or 0's and the highs or 1's do not turn off output source follower 19 but rather drive the 50 ohm line connected thereto.

Figure 2:
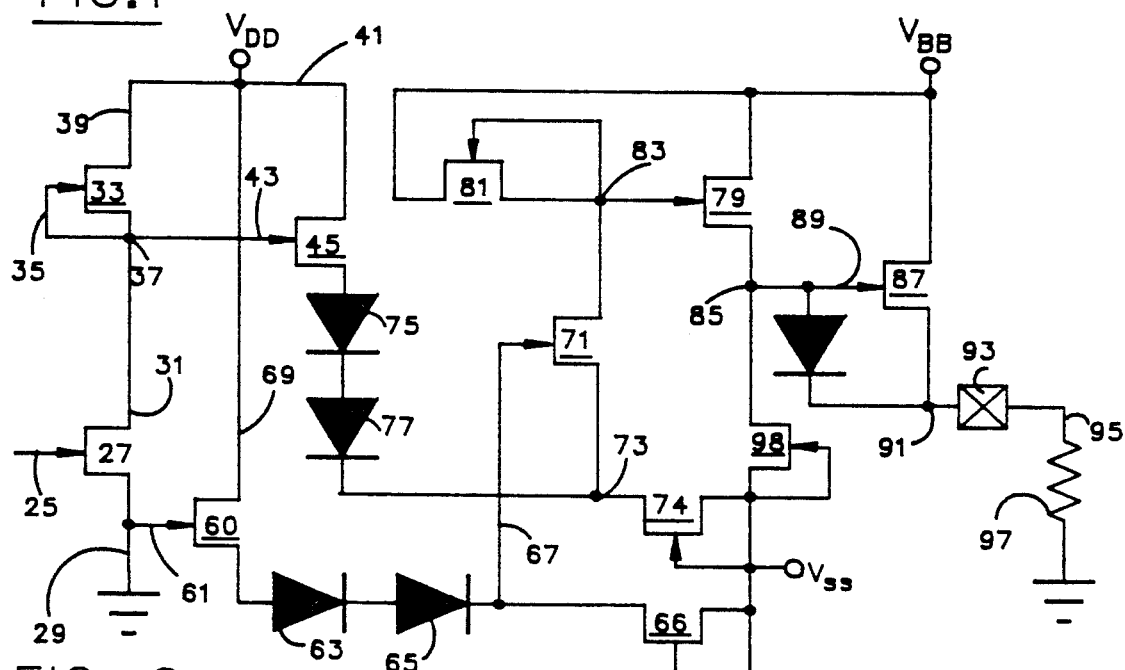
FIG. 2 shows one working embodiment for driving 50 ohm lines employing all FETs and diodes; and, FIG. 3 is a further embodiment employing MESFETS, diodes and saturated resistors.

In FIG. 2, the driver signal input lead is shown at 25 as being the gate lead for a MESFET 27, connected as an inverter, with source lead 29 extending to ground and drain lead 31 extending to the source of another MESFET transistor 33, connected to serve as a pull up device, with its gate lead 35 tied back to its source at node 37, and its drain lead 39 extending to common $+V_{DD}$ lead 41.

MESFETs 27 and 33 comprise the Logic section 13 (FIG. 1) and provide good 0 levels and fast pull up when the channels of devices 27 and 33 are in the ratio of 8 and 5 microns wide respectively. Consequently, logic high and logic low signals appear on gate 43 of source follower MESFET 45, inverted due to MESFET 27.

In considering FIG. 2, the devices available from conventional GaAs processing are depletion MESFETs with a pinch-off voltage of approximately $-1$ volt, saturated resistors, which are similar to a MESFET with no gate electrode, and diodes.

A process suitable for manufacturing the GaAs circuit of this invention is set forth in *IEEE TRANSACTIONS ON ELECTRON DEVICES* Vol. ED27, No. 6 Jun. 1980, at pages 1116–1124. The saturated resistors are further described in *IEEE TRANSACTIONS ON MICROWAVE THEORY AND TECHNIQUES* Vol. MTT 30, No. 7, Jul. 1982, at pages 1007–1013.

$V_{DD}$ and $V_{BB}$ are chosen to be approximately $+2.5$ volts with $V_{SS}$ being about $-2.0$ volts. $V_{REF}$ is generated from transistor 60, connected as a source follower, with its gate being grounded to lead 61 and its source extending through diodes 63 and 65 to the $V_{REF}$ lead 67. Lead 67 is connected in a voltage divider comprising the two diodes 63, 65 and a pull down FET 66 having its gate tied to its source and also tied to the $V_{SS}$ supply of $-2.0$ volts. The diodes level shift the drain potential of MESFET 60 by two diode drops.

This latter circuit, including source follower transistor 60, diodes 63 and 65 and pull down transistor 66 connected between the $V_{DD}$ source over the drain lead 69 of source follower 60 and including the $V_{SS}$ supply, is simply provided to ensure a stable reference voltage on lead 67 of approximately $-1$ volt as $V_{REF}$. This $-1$ volt is the gate bias for common gate amplifier 71 which has its source connected to node 73 such that the high and low voltages passing through source follower transistor 45 are downshifted by diodes 75 and 77; MESFET 74, with its gate tied to its source, serving as a pull down device. Thus, when node 73 is at a 1 level, which appears at the source of common gate amplifier 71, the common gate amplifier 71 is off because the gate $V_{REF}$ on lead 67 is more negative than the pinch-off voltage of the source at node 73. With transistor 71 turned off, the gate of transistor 79, connected as a source follower, will go to $V_{BB}$ ($+2.5$ volts) from the biasing of pull up transistor 81. Transistor 79 and pull up transistor 81 will transfer the 1 level at node 83 to node 85 with MESFET 98 having its gate tied to its source, serving as a pull down device. The 1 level potential at node 85 is the 1 level potential of node 83 buffered by transistor 79.

MESFET 87 is also connected as a source follower to transfer the 1 level at its gate 89 to its source at node 91. The 1 level potential at 91 is the 1 level potential of node 85 buffered by transistor 87. This transistor is sized to drive an external 50 ohm line 95 connected to bidirectional pad 93.

The other situation effective in this circuit is when the gate 43 of MESFET 45 is at a 0 level rather than a 1 level. This 0 level is passed to the source of MESFET 45 and level shifted down through diodes 75 and 77.

Common gate transistor 71 will be turned on for this condition because the gate potential on lead 67 ($V_{REF}$) is not more negative than the source potential which is at the logic low level.

The gate of transistor 79 will be pulled down to a logic low level by the turning on of transistor 71. The logic low level at the gate of MESFET 79 will be transferred to its source which is the gate of MESFET 87 (node 85). It is important to note that the logic low level at the gate of transistor 87 be more negative than its source by the pinch-off voltage of transistor 87. By achieving this, transistor 87 will be completely turned off thereby realizing a bidirectional pad.

Having the ability to turn off MESFET 87, then another driver in the system can drive the bus or the bus will be pulled to ground by the 50 ohm terminating resistor 97. The diode 99 connected across the gate and source of transistor 87 is used for protecting against shorts at node 91. If node 91 is shorted without diode 99, then the current through the gate of transistor 87 would become too large for transistor 87 to maintain operability. With the diode 99 across transistor 87 the extra current produced from shorting at node 91 will not interfere with operability of transistor 87.

Figure 3:
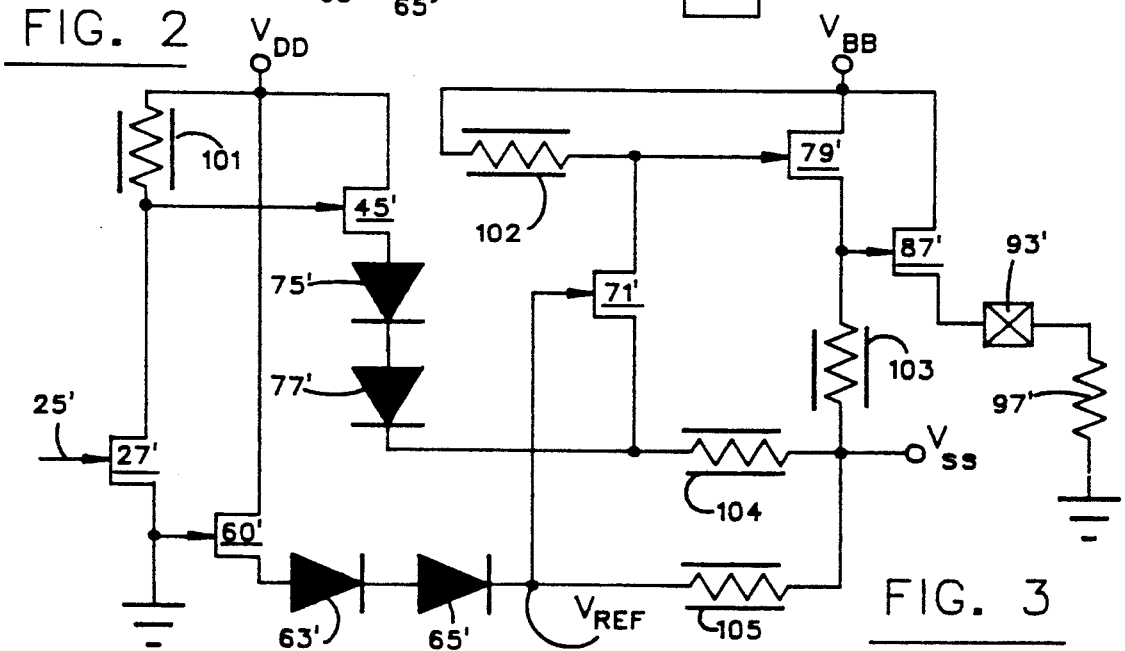

In FIG. 3, the circuit performs the function of the circuit of FIG. 2 and the only differences are the substitution of saturated resistances for MESFETs having their gates tied to their sources. Thus, saturated resistor 101 is shown replacing MESFET 33, saturated resistor 102 replaces MESFET 81, saturated resistor 103 replaces MESFET 98, saturated resistor 104 replaces MESFET 74, and saturated resistor 105 replaces MESFET 66. Other components bear the primes of the numbers used in FIG. 2. The saturated resistors are similar to a MESFET with no gate electrode and can replace the same. They may be polarized vertically or horizontally depending upon the crystalline orientation of the wafer and whether they are laid out in one direction or at right angles to said direction. They serve as relatively inexpensive current sources and are illustrated here as pull up or pull down devices. The saturated resistors are sized by the width of their channels.

Source follower 79' is optional but does not capacitive drive for faster signal handling.

Also, all devices utilized herein are Schottky circuit devices because the metal of the gate lays on the channel. A typical example of sizing will now be illustrated simply by way of example.

| FIG. 2 | | FIG. 3 | | |
|---|---|---|---|---|
| | | | Channel Width (c) | |
| Device | Channel Width (c) | Device | Horizontal | Vertical |
| 33 | 5 | 101 | 1.72 | 1.04* |
| 27 | 8 | 102 | 3 | |
| 45 | 21 | 103 | 26 | |
| 60 | 6 | 104 | 13 | |
| 81 | 9 | 102 | 3 | 1.88 |
| 71 | 27 | | | |
| 79 | 76 | | | |
| 87 | 377 | | | |
| 98 | 76 | 103 | 26 | 16 |
| 74 | 38 | 104 | 13 | 8 |
| 66 | 6 | 105 | 2 | 1.25* |
| 75 | 10.5 | | | |
| 77 | 10.5 | | | |
| 63 | 3 | | | |
| 65 | 3 | | | |

*not practical sizes

A typical voltage swing through the circuit of FIG. 2 for the parameters, by way of example, is as follows:

| Input at 25 | −1.2 V to +0.5 V | |
|---|---|---|
| Node 37 | +0.3 V to +2.5 V | |
| Node 73 | −1.4 V to 0 V | |
| Node 83 | −1.2 V to +2.5 V | |
| Node 85 | −1.2 V to +2.2 V | |
| Node 91 | 0 V to +1.7 V | (0 V level due to Resistor 97) |

In FIG. 3, a diode corresponding to 99 in FIG. 2 has been omitted but certainly may be used for short protection. The saturated resistor channel widths have been given for either polarization. Solely vertical polarized devices or mixed vertical and horizontal polarized devices may be employed by using the formulas to calculate the proper channel widths.

The level shifting in either circuit may be effected using more or less diodes.

In summary, the circuits of the present invention have two modes; they drive high or they float. In the drive high state, the output stage is conductive due to a high signal level, and in the float state, the output stage is off.

What is claimed is:

1. A gallium arsenide driver for level shifting and amplifying logic high and low signals and having float capability, comprising in combination:

a level shift circuit comprising a first MESFET having a gate lead for receiving said signals, a drain lead for connection to a first source of potential and a source lead;

a common gate amplifier comprising a second MESFET having a gate lead, drain lead and a source lead;

at least one level shifting diode connected between the source lead of the first MESFET and the source lead of the second MESFET;

a pull down device connected between the source lead of the second MESFET and a second source of potential;

a further source of potential;

a pull up device connected between said drain lead of the second MESFET and said further source;

an output MESFET having a source output transmission line load connected to ground;

a bidirectional pad interposed between the transmission line load and the output MESFET source;

the output MESFET having its drain connected to said further source;

a gate connection for said output MESFET from the drain lead of said second MESFET; and, means applying a fixed reference potential to the gate lead of said second MESFET to establish conduction therein only when a low logic signal is applied to its source, whereby when the signal is low at the gate of the first MESFET, the output MESFET is cut off because said low signal is down shifted by the level shifting diode such that the second MESFET is turned on to decrease the gate signal at the output MESFET.

2. The driver of claim 1 wherein:
said pull up and pull down devices comprise MESFETs with their gates connected to their sources, respectively.

3. The driver of claim 2 wherein:
said pull up and pull down devices comprise saturated resistors.

4. The driver of claim 2 wherein:
at least one of said pull up and pull down devices comprises a saturable resistor.

* * * * *